United States Patent
Yamamoto et al.

(10) Patent No.: US 7,595,006 B2
(45) Date of Patent: Sep. 29, 2009

(54) PIEZOELECTRIC CERAMIC COMPOSITION AND PIEZOELECTRIC ACTUATOR

(76) Inventors: Atsushi Yamamoto, Murata Manufacturing Co., Ltd., Intellectual Property Department, 10-1, Higashikotari 1-chome, Nagaokakyo-shi, Kyoto-Fu, 617-8555 (JP); Koji Ogiso, Murata Manufacturing Co., Ltd., Intellectual Property Department, 10-1, Higashikotari 1-chome, Nagaokakyo-shi, Kyoto-Fu, 617-8555 (JP); Koichi Hayashi, Murata Manufacturing Co., Ltd., Intellectual Property Department, 10-1, Higashikotari 1-chome, Nagaokakyo-shi, Kyoto-Fu, 617-8555 (JP)

( * ) Notice: Subject to any disclaimer, the term of this patent is extended or adjusted under 35 U.S.C. 154(b) by 325 days.

(21) Appl. No.: 11/767,287

(22) Filed: Jun. 22, 2007

(65) Prior Publication Data

US 2007/0252483 A1 Nov. 1, 2007

Related U.S. Application Data

(63) Continuation of application No. PCT/JP2005/021261, filed on Nov. 18, 2005.

(30) Foreign Application Priority Data

Jan. 14, 2005 (JP) ............... 2005-007764

(51) Int. Cl.
*C04B 35/493* (2006.01)
*H01L 41/187* (2006.01)

(52) U.S. Cl. ............... 252/62.9 PZ; 501/134; 501/135; 310/311; 310/365; 310/366

(58) Field of Classification Search .......... 252/62.9 PZ; 501/134, 135; 310/311, 365, 366
See application file for complete search history.

(56) References Cited

U.S. PATENT DOCUMENTS 7,344,654 B2 * 3/2008 Ogiso et al. ............ 252/62.9 PZ
2004/0021399 A1 2/2004 Ogawa et al.

FOREIGN PATENT DOCUMENTS

EP 1 354 861 A1 10/2003

(Continued)

OTHER PUBLICATIONS

Written Opinion of the International Searching Authority dated Feb. 14, 2006.

*Primary Examiner*—C. Melissa Koslow
(74) *Attorney, Agent, or Firm*—Dickstein, Shapiro, LLP.

(57) ABSTRACT

A piezoelectric ceramic composition has the composition formula $(Pb_{(a-b)}Me_b)\{(Ni_{(1-c)\cdot d/3}Zn_{c\cdot d/3}Nb_{2/3})_zTi_xZr_{(1-x-z)}\}O_3$, wherein Me represents at least one element selected from the group consisting of Ba, Sr and Ca; a, b, c, d, x and z satisfy the inequalities $0.975 \leq a \leq 0.998$, $0 \leq b \leq 0.05$, $1 < d \leq 1.40$, and $0.39 \leq x \leq 0.47$; and c and z are located in a region surrounded by lines connecting Point A (z=0.25, c=0.1), Point B (z=0.25, c=0.85), Point C (z=0.1, c=0.6), Point D (z=0.075, 0.5), Point E (z=0.05, c=0.2), and Point F (z=0.05, c=0.1) or located on the lines in the z-c plane. Therefore, the piezoelectric ceramic composition can be fired at a low temperature and is effective in achieving a large piezoelectric constant, a high Curie point and a small dielectric constant. A piezoelectric actuator contains the piezoelectric ceramic composition.

20 Claims, 1 Drawing Sheet

FOREIGN PATENT DOCUMENTS

| | | |
|---|---|---|
| JP | 60-103079 | 6/1985 |
| JP | 2-258660 | 10/1990 |
| JP | 5-58729 | 3/1993 |
| JP | 11-322422 | 11/1999 |
| JP | 2003-335579 | 11/2003 |
| JP | 2005-001926 | 1/2005 |

* cited by examiner

PIEZOELECTRIC CERAMIC COMPOSITION AND PIEZOELECTRIC ACTUATOR

This is a continuation of application Ser. No. PCT/JP2005/02161, filed Nov. 18, 2005.

TECHNICAL FIELD

The present invention relates to complex perovskite-type piezoelectric ceramic compositions prepared by doping Pb(Ti, Zr)O$_3$ with Pb(Ni, Nb)O$_3$ and/or Pb(Zn, Nb)O$_3$. The present invention particularly relates to a piezoelectric ceramic composition suitable for piezoelectric actuators and a piezoelectric actuator.

BACKGROUND ART

Piezoelectric ceramic compositions principally containing lead zirconate titanate (Pb(Ti, Zr)O$_3$, hereinafter referred to as "PZT") have excellent piezoelectric properties and therefore are widely used for piezoelectric devices such as piezoelectric actuators.

In general, the properties required for the piezoelectric ceramic compositions include a large piezoelectric constant, a small dielectric constant and a high Curie point, and the like.

In order to enhance properties of the piezoelectric ceramic compositions containing PZT, the B site components Ti and Zr are replaced with another atom in such a manner that PZT is doped with Pb(Ni$_{1/3}$Nb$_{2/3}$)O$_3$ (hereinafter referred to as "PNN"), Pb(Zn$_{1/3}$Nb$_{2/3}$)O$_3$ (hereinafter referred to as "PZN"), and/or the like.

For example, Patent Document 1 discloses a quaternary piezoelectric ceramic material represented by the composition formula Pb$_A$[(Zn$_{1/3}$Nb$_{2/3}$)$_W$(Ni$_{1/3}$Nb$_{2/3}$)$_X$Ti$_Y$Zr$_Z$]O$_3$, wherein W+X+Y+Z=1, 0.985<A≦0.995, 0.10≦W+X≦0.70, 0.20≦Y≦0.50, and 0.10≦Z≦0.50.

In addition to such a quaternary composition, the A site component Pb is replaced with another element such as Ca, Sr or Ba such that properties are enhanced.

For example, Patent Document 2 discloses a piezoelectric ceramic composition represented by the composition formula Pb$_A$[(Zn$_{1/3}$Nb$_{2/3}$)$_W$(Ni$_{1/3}$Nb$_{2/3}$)$_X$Ti$_Y$Zr$_Z$]O$_3$, wherein W+X+Y+Z=1, 0.960≦A≦0.985, 0≦W≦0.70, 0≦X 0.50, 0.25≦W+X≦0.70, 0.20≦Y≦0.40, 0.057≦Z≦0.375, where up to five mole percent of Pb is replaced with at least one of Ca, Sr, and Ba.

Patent Document 1: Japanese Unexamined Patent Application Publication No. 11-322422

Patent Document 2: Japanese Unexamined Patent Application Publication No. 60-103079

DISCLOSURE OF THE INVENTION

Problems to be Solved by the Invention

In the invention disclosed in Patent Document 1, the firing temperature is 1100° C. to 1150° C. due to the composition, and the piezoelectric ceramic material can be fired together with internal electrodes made of an Ag70-Pd30 alloy.

From an economic viewpoint, the content of Pd is preferably small because Pd is an expensive material. In order to reduce the Pd content, the firing temperature needs to be reduced. However, a reduction in firing temperature is likely to impair properties such as a piezoelectric constant. In order to be more practical, the firing temperature needs to be reduced without impairing properties such as a piezoelectric constant.

In the invention disclosed in Patent Document 2, the piezoelectric ceramic composition has a large piezoelectric constant, a large electromechanical coefficient and a high Curie point, sufficient for practical use.

The piezoelectric ceramic composition has a problem that the firing temperature is about 1200° C. and the dielectric constant is 3410 or more, that is, the firing temperature is high and the dielectric constant is large. Hence, the piezoelectric ceramic composition is not suitable for high-voltage applications.

If voltages are applied to piezoelectric devices such as piezoelectric actuators to operate the piezoelectric devices, the temperature of the piezoelectric devices is increased by the heat generated during the operation thereof. In particular, a piezoelectric device operated with a voltage higher than the coercive electric field thereof generates a large amount of heat. An increase in the dielectric constant of a piezoelectric material in the piezoelectric device increases the heat generated from the piezoelectric device. This is because an increase in dielectric constant increases capacitance to increase current. If the device temperature approaches the Curie point thereof, the piezoelectric properties thereof are significantly impaired and therefore the distortion is reduced. If the device temperature exceeds the Curie point thereof, the piezoelectric actuator fails to function because the occurrence of phase transition causes depolarization. Therefore, the piezoelectric material needs to have a large piezoelectric constant, a small dielectric constant and a high Curie point such that the piezoelectric actuator can be continuously operated.

In particular, a piezoelectric actuator operated at a high electric field of 1 kV/mm or more preferably has a Curie point of 280° C. or more and a dielectric constant of 3000 or less.

The present invention has been made to solve the above problems. It is an object of the present invention to provide a piezoelectric ceramic composition which can be fired at a low temperature and which has a large piezoelectric constant, a high Curie point and a small dielectric constant.

Means for Solving the Problems

In order to achieve the above object, the inventors have made intensive research and have then found a piezoelectric ceramic composition that can be fired at a low temperature. The piezoelectric ceramic composition is a quaternary complex oxide (PNN—PZN-PZ-PT) prepared by adding third components such as Ni, Zn and Nb to PZT. In the complex oxide, the molar ratio of an acceptor element (Ni or Zn) that has a valence less than that of Ti or Zr is greater than the stoichiometric composition thereof by a predetermined molar amount and therefore the B site acceptor is excessive. Furthermore, the molar ratio of each of the other components is within a predetermined range. The inventors have also found that the piezoelectric ceramic composition is useful in manufacturing a piezoelectric actuator having a larger piezoelectric constant, a higher Curie point and a smaller dielectric constant as compared to a piezoelectric ceramic composition in which the b site is stoichiometric or a piezoelectric ceramic composition in which the molar ratio of the acceptor element is adjusted to be less than the stoichiometric composition such that the B site donor is excessive.

The present invention has been made on the basis of the above findings. A piezoelectric ceramic composition according to the present invention has the composition formula (Pb$_{(a-b)}$Me$_b$){(Ni$_{(1-c)\cdot d/3}$Zn$_{c\cdot d/3}$Nb$_{2/3}$)$_z$Ti$_x$Zr$_{(1-x-z)}$}O$_3$, wherein Me represents at least one element selected from the group consisting of Ba, Sr and Ca; a, b, c, d, x and z satisfy the inequalities 0.975≦a≦0.998, 0≦b≦0.05, 1<d≦1.40, and 0.39≦x≦0.47; and c and z are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in the z-c plane.

Furthermore, d preferably satisfies the inequality $1.02 \leq d \leq 1.40$.

A piezoelectric actuator according to the present invention includes a ceramic body containing the piezoelectric ceramic composition. The piezoelectric actuator may further include internal electrodes in addition to the ceramic body.

The piezoelectric actuator can be fired at a low temperature and therefore has advantages when the internal electrodes contain Ag.

Advantages

The piezoelectric ceramic composition of the present invention can be fired at a low temperature because the B site thereof is acceptor excessive. The piezoelectric ceramic composition is effective in achieving a larger piezoelectric constant, a higher Curie point and a smaller dielectric constant as compared to a piezoelectric ceramic composition in which the B site is stoichiometric or donor excessive. The piezoelectric ceramic composition is suitable for piezoelectric actuators.

In the above composition formula, when d satisfies the inequality $1.02 \leq d \leq 1.40$, the piezoelectric ceramic composition can be fired at a lower temperature compared to a piezoelectric ceramic composition in which the B site is stoichiometric or donor excessive.

A piezoelectric actuator having excellent piezoelectric properties can be obtained at the low firing temperature of 950° C. to 1000° C. In particular, the piezoelectric actuator has a large piezoelectric constant $d_{33}$ of 530 pm/V or more, a small dielectric constant εr of less than 3000, and a high Curie point of 280° C. or higher even if a high voltage of 2 kV/mm is applied to the piezoelectric actuator.

REFERENCE NUMERALS

Figure 1:
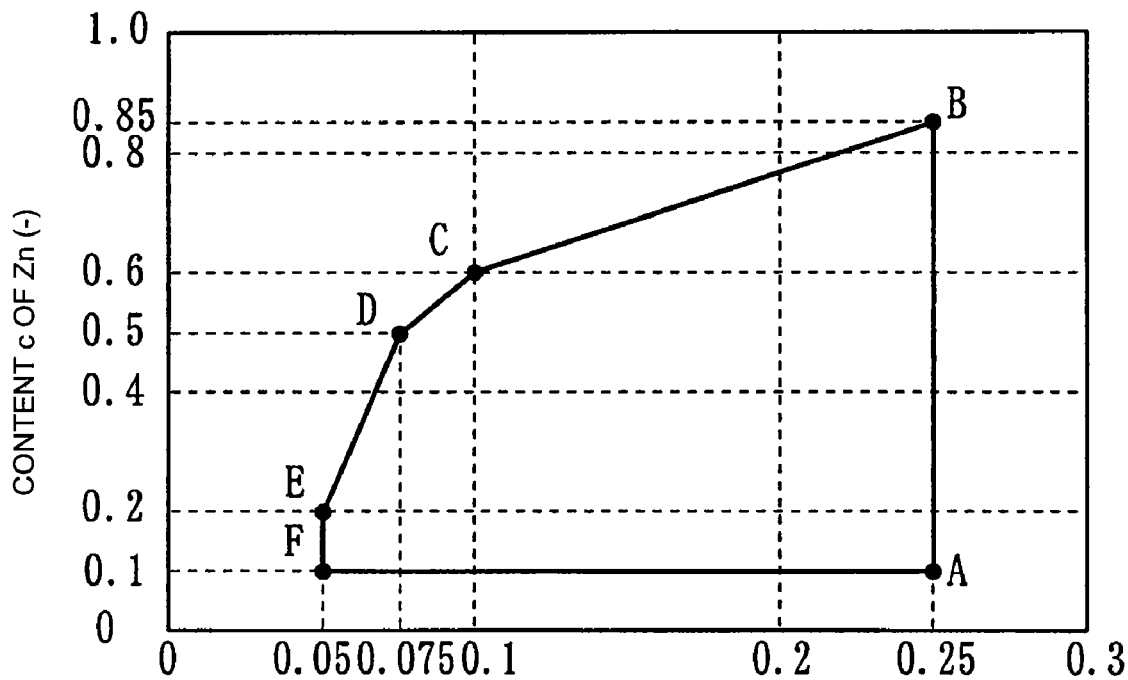
FIG. 1 is a graph showing the relationship between the molar ratio z of a third component in a piezoelectric ceramic composition according to the present invention and the molar ratio c of Zn to Ni in the third component.

10: ceramic body
21 and 22: internal electrodes
31 and 32: external electrodes

BEST MODE FOR CARRYING OUT THE INVENTION

The best mode for carrying out the present invention will now be described with reference to the attached drawings.

A piezoelectric ceramic composition according to the present invention is a complex oxide containing four components: PNN, PZN, PZ and PT, that is, Pb(Ni, Nb)O$_3$, Pb(Zn, Nb)O$_3$, PbZrO$_3$, and PbTiO$_3$. The piezoelectric ceramic composition has a perovskite crystal structure (general formula ABO$_3$) and is represented by the following composition formula:

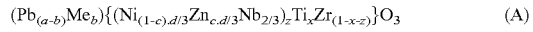

(A)

In the composition formula, Me represents at least one element selected from the group consisting of Ba, Sr and Ca and the molar amount a of Pb and Me, which are A site components, the molar amount b of Me in the A site, the molar ratio (hereinafter simply referred to as "the molar ratio of Zn") c of the content of Zn to the sum of the content of Ni and the Zn content, the molar amount d of an acceptor (Ni or Zn) in a third component, the molar amount x of Ti in the B site, and the molar amount z of the third component in the B site satisfy the following inequalities:

$$0.975 \leq a \leq 0.998 \quad (1)$$

$$0 \leq b \leq 0.05 \quad (2)$$

$$1 < d \leq 1.4 \quad (3)$$

$$0.39 \leq x \leq 0.47 \quad (4)$$

Furthermore, the molar ratio c of Zn in the B site and the molar amount z of the third component (Ni, Zn, and Nb) are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in the z-c plane as shown in FIG. 1.

Since the molar values a, b, d, and x in Formula (A) satisfy Inequalities (1) to (4) and the molar values c and z are located in the region, which is inequilateral Hexagon ABCDEF, or located on the lines shown in FIG. 1, the piezoelectric ceramic composition can be fired at a low temperature and has a large piezoelectric constant, a small dielectric constant, and a high Curie point.

Since the piezoelectric ceramic composition can be fired at a low temperature, low cost can be achieved by increasing the content ratio of Ag to Pd in electrodes and the dielectric constant thereof is prevented from being reduced because the diffusion of Ag in the ceramic is prevented even if the piezoelectric ceramic composition is fired together with internal electrodes containing Ag, Pd and the like. Since the dielectric constant thereof is small, a piezoelectric device made thereof generates a reduced amount of heat when the piezoelectric device is operated under a high voltage. Furthermore, since the Curie point thereof is high, the temperature of the piezoelectric device can be suppressed to be less than the Curie point thereof even though heat is generated therefrom, thereby preventing piezoelectric properties of the piezoelectric device from being impaired. Since the piezoelectric constant thereof is large, the piezoelectric device has a large distortion.

The molar ratio d the acceptor (Ni or Zn) in the third component preferably satisfies the following inequality:

$$1.02 \leq d \leq 1.4 \quad (3')$$

This enhances the effect of reducing the firing temperature. In particular, the firing temperature thereof is about 50° C. less than that of a stoichiometric composition and is about 100° C. less than that of a donor-excessive composition.

The reasons why a, b, d, and x are limited within the ranges defined by Inequalities (1) to (4) are as described below.

(1) Molar Amount a

When the molar ratio a of the A site component, which principally contains Pb, in the piezoelectric ceramic composition, which contains PNN, PZN, PZ, and PT, exceeds 0.998 to approach the stoichiometric composition, the piezoelectric ceramic composition has a reduced piezoelectric constant. This is probably because Pb(Ni, Nb)O$_3$—Pb(Zn, Nb)O$_3$, that is the third component, is not completely dissolved in Pb(Zr, Ti)O$_3$ and therefore an apparently excessive amount of the A site component segregates at grain boundaries. The approach of the molar amount a of the A site component to the stoichiometric composition promotes synthesis and/or sintering reaction. However, when the molar amount of the A site component exceeds 0.998 to approach the stoichiometric composition, the reaction proceeds excessively during calcining and therefore the sintering properties thereof are impaired.

In contrast, when the molar amount a of the A site component is less than 0.975, the sintering properties are impaired and therefore the sintering temperature thereof is increased. Furthermore, the shift from the stoichiometric composition is excessively large and therefore heterogeneous phases are formed. This seriously impairs the piezoelectric properties such as a piezoelectric constant.

According to the above reason, the piezoelectric ceramic composition of the present invention is prepared such that the molar amount a of the A site component satisfies the inequality $0.975 \leq a \leq 0.998$.

(2) Molar Amount b

The piezoelectric constant of the piezoelectric ceramic composition can be increased as required in such a manner that Pb in the A site component is partially replaced with Element Me (Ba, Ca or Sr). However, if the molar amount b of Element Me in the A site component exceeds 0.05, the Curie point Tc may be reduced.

Thus, the molar amount b is adjusted to 0.05 or less.

(3) Molar Amount d

When the molar amount d of the acceptor element (Ni or Zn) in the third component is greater than one, the content of the acceptor element in the B site is excessive. This allows the piezoelectric ceramic composition to be fired at a low temperature. In order to allow the piezoelectric ceramic composition to be fired at a low temperature, it is preferable that $1.02 \leq d$. In contrast, when d exceeds 1.4, there is a problem in that sintering properties thereof are impaired.

Thus, the molar amount d of the acceptor element (Ni or Zn) in the third component satisfies the inequality $1 < d \leq 1.4$ and more preferably satisfies the inequality $1.02 \leq d \leq 1.4$.

(4) Molar Amount x

In the piezoelectric ceramic composition, which contains PNN, PZN, PZ and PT, the molar amount x of Ti is adjusted such that a solid solution thereof is close to the MPB (morphotoropic phase boundary). This allows the piezoelectric ceramic composition to have a large piezoelectric constant.

From the above view point, the molar amount x of x is adjusted to satisfy the inequality $0.39 \leq x \leq 0.47$.

The molar ratio c of Zn in the third component and the molar amount z of the third component (Ni, Zn and Nb) are adjusted to be located in the region, which is surrounded by the lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z =0.05, c=0.1) or located on the lines in the z-c plane as described above. This is because when the molar values of c and z do not satisfy the above condition, a large piezoelectric constant and a high Curie point cannot be achieved together, and abnormal grain growth may occur.

A piezoelectric actuator manufactured by the use of the piezoelectric ceramic composition will now be described.

Figure 2:
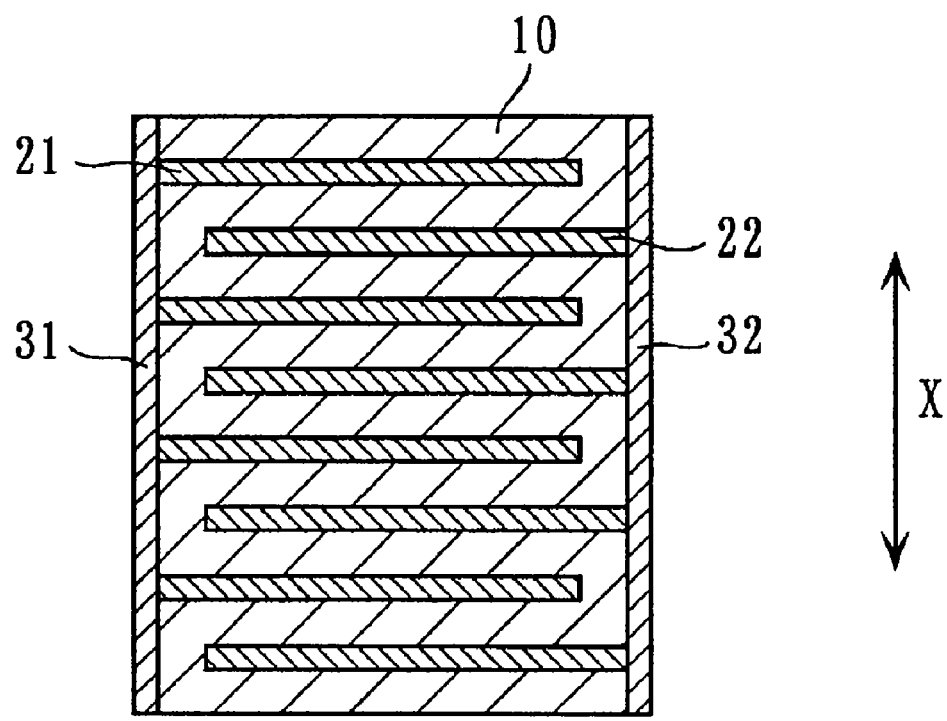
FIG. 2 is a sectional view of a piezoelectric actuator according to an embodiment of the present invention.

FIG. 2 is a sectional view of the piezoelectric actuator.

The piezoelectric actuator includes a ceramic body 10 containing the piezoelectric ceramic composition, internal electrodes 21 and 22 arranged in the ceramic body 10, and external electrodes 31 and 32 which are disposed on the ceramic body and which are electrically connected to the internal electrodes 21 and 22, respectively.

The piezoelectric actuator is distorted in the direction indicated by Arrow X in this figure, that is, in the thickness direction of the piezoelectric actuator by the piezoelectric effect when a voltage is applied between the external electrodes 31 and 32.

A method for manufacturing the piezoelectric actuator will now be described.

Source powders of $Pb_3O_4$, $BaCO_3$, $TiO_2$, $ZrO_2$, NiO, ZnO and $Nb_2O_5$ are weighed such that the molar values of a, b, c, d, x, and z satisfy Formula (A). The source powders are wet-ground in a ball mill. $CaCO_3$, $SrCO_3$, and/or the like may be added to the source powders as required. The resulting source powders preferably have an average particle size (D90) of 1 μm or less.

The powder mixture obtained is calcined at a predetermined temperature of about 800° C. to 900° C. whereby a calcined powder is prepared. The calcined powder and an aqueous solution of a binder are mixed together in a pot mill, whereby slurry is obtained. The slurry is formed into ceramic green sheets by a known process such as a doctor blade process.

A conductive paste is prepared so as to contain Ag and Pd at a weight ratio of 7:3. Predetermined patterns for the internal electrodes are formed on some of the ceramic green sheets by a screen printing process. The material for forming the internal electrodes may contain Cu, Ni or the like.

A predetermined number of the ceramic green sheets having the internal electrode patterns are stacked. The unprinted ceramic green sheets having no internal electrode patterns are pressed against both sides of the stack, whereby a compact is prepared. The compact is cut into pieces having a predetermined size. The pieces are provided in an alumina sagger and then fired at a predetermined temperature of about 950° C. to 1200° C. whereby sintered bodies are obtained.

A conductive paste principally containing Ag is applied onto end faces of each sintered body and is then baked, whereby the external electrodes are formed. The sintered body is subjected to polarization at a field intensity of about 3 kV/mm, whereby the piezoelectric actuator is obtained.

Since the piezoelectric actuator contains the piezoelectric ceramic composition, the piezoelectric actuator has a large piezoelectric constant and can be significantly distorted. Since the dielectric constant is small and the Curie point is high, the temperature of the actuator does not approach or exceed its Curie point even if the actuator is continuously operated under a high electric field; hence, piezoelectric properties thereof can be prevented from being impaired.

The above embodiment is only for exemplification and should not be construed as limitative. In the embodiment, the oxide powders are used. Instead, carbonate or hydroxide powders may be used if the piezoelectric ceramic composition has the above composition formula.

The piezoelectric ceramic composition may further contain a trace amount of impurities if the piezoelectric properties thereof are not impaired. For example, a trace amount of $HfO_2$ can be present in the $ZrO_2$ source powder and a trace amount of $Ta_2O_5$ can be present in the $Nb_2O_5$ source powder.

In the embodiment, the piezoelectric actuator is a multilayer type. The piezoelectric actuator may be a single-layer type. An application of the piezoelectric ceramic composition is not limited to the piezoelectric actuator. The piezoelectric ceramic composition may be used for piezoelectric buzzers.

The present invention will be further described in detail with reference to examples.

EXAMPLE 1

$Pb_3O_4$, $BaCO_3$, NiO, ZnO, $Nb_2O_5$, $TiO_2$ and $ZrO_2$, which were ceramic sources, were weighed such that the final piezoelectric ceramic compositions had the composition formulas shown in Tables 1 and 2. The ceramic sources and pure water were fed into a pot mill and were then mixed together for 16 hours. The source mixtures were calcined at 830° C., whereby calcined powders (piezoelectric ceramic compositions) were obtained. Each calcined powder was mixed with an organic binder and pure water. The mixture was kneaded for 16 hours in a pot mill, whereby a ceramic slurry was obtained. The ceramic slurry was formed into ceramic green sheets by a doctor blade process. A predetermined number of the untreated ceramic green sheets were stacked, debindered at 360° C. for two hours, and then fired at 1000° C. for five hours in oxygen, whereby a bulk sintered body was obtained. External electrodes made of an Ag—Cu alloy were provided on both end faces of the bulk sintered body by vapor deposition. The bulk sintered body was subjected to polarization at a field density of 3 kV/mm in oil. Bulk samples for Samples 1 to 43 were prepared as described above.

The bulk samples were measured for piezoelectric constant $d_{33}$, dielectric constant $\epsilon r$ and Curie point Tc.

The piezoelectric constant $d_{33}$ of each sample was determined as follows: the sample was measured for distortion factor in the thickness direction with an inductive prove and a differential transformer by applying an electric field of 2 kV/mm to the sample in the form of a 0.1 Hz triangular wave and the distortion factor thereof was divided by the electric field.

The dielectric constant $\epsilon r$ was measured at a frequency of 1 kHz with an RF impedance analyzer (HP 4294A, Hewlett-Packard).

Furthermore, the temperature characteristic of the dielectric constant $\epsilon r$ was measured. The temperature at which the dielectric constant $\epsilon r$ peaked was defined as the Curie point Tc.

Tables 1 and 2 show the compositions and measurements of the samples. In both Tables, samples with an asterisk are outside the scope of the present invention.

TABLE 1

| | $(Pb_{(a-b)}Ba_b)\{(Ni_{(1-c)\cdot d/3}Zn_{c\cdot d/3}Nb_{2/3})_zTi_xZr_{(1-x-z)}\}O_3$ | | | | | | Piezoelectric constant $d_{33}$ (pm/V) | Dielectric constant $\epsilon r$ (-) | Curie point Tc (° C.) |
|---|---|---|---|---|---|---|---|---|---|
| Samples | a | b | c | d | x | z | | | |
| 1* | 1.000 | 0.000 | 0.50 | 1.040 | 0.4100 | 0.200 | — | — | — |
| 2 | 0.998 | 0.000 | 0.50 | 1.040 | 0.4100 | 0.200 | 640 | 1920 | 310 |
| 3 | 0.990 | 0.000 | 0.50 | 1.040 | 0.4100 | 0.200 | 830 | 2800 | 310 |
| 4 | 0.975 | 0.000 | 0.50 | 1.040 | 0.4100 | 0.200 | 620 | 1710 | 310 |
| 5* | 0.970 | 0.000 | 0.50 | 1.040 | 0.4100 | 0.200 | — | — | — |
| 6 | 0.995 | 0.000 | 0.50 | 1.050 | 0.4450 | 0.100 | 770 | 2310 | 350 |
| 7 | 0.995 | 0.025 | 0.50 | 1.050 | 0.4450 | 0.100 | 830 | 2360 | 320 |
| 8 | 0.995 | 0.050 | 0.50 | 1.050 | 0.4450 | 0.100 | 820 | 2350 | 290 |
| 9* | 0.995 | 0.075 | 0.50 | 1.050 | 0.4450 | 0.100 | 840 | 2430 | 270 |
| 10 | 0.990 | 0.000 | 0.50 | 1.020 | 0.4100 | 0.200 | 820 | 2680 | 310 |
| 11 | 0.990 | 0.000 | 0.50 | 1.300 | 0.4100 | 0.200 | 780 | 2690 | 310 |
| 12 | 0.990 | 0.000 | 0.50 | 1.400 | 0.4100 | 0.200 | 630 | 1930 | 310 |
| 13* | 0.990 | 0.000 | 0.50 | 1.500 | 0.4100 | 0.200 | — | — | — |
| 14* | 0.990 | 0.000 | 0.50 | 1.040 | 0.3800 | 0.200 | 420 | 1230 | 290 |
| 15 | 0.990 | 0.000 | 0.50 | 1.040 | 0.3900 | 0.200 | 530 | 1960 | 290 |
| 16 | 0.990 | 0.000 | 0.50 | 1.040 | 0.4550 | 0.050 | 740 | 2050 | 370 |
| 17 | 0.990 | 0.000 | 0.50 | 1.040 | 0.4700 | 0.050 | 610 | 1630 | 380 |
| 18* | 0.990 | 0.000 | 0.50 | 1.040 | 0.4800 | 0.050 | 410 | 1110 | 380 |

TABLE 2

| | $(Pb_{(a-b)}Ba_b)\{(Ni_{(1-c)\cdot d/3}Zn_{c\cdot d/3}Nb_{2/3})_zTi_xZr_{(1-x-z)}\}O_3$ | | | | | | Piezoelectric constant $d_{33}$ (pm/V) | Dielectric constant $\epsilon r$ (-) | Curie point Tc (° C.) |
|---|---|---|---|---|---|---|---|---|---|
| Samples | A | b | c | d | x | z | | | |
| 19* | 0.990 | 0.000 | 0.00 | 1.040 | 0.4000 | 0.250 | 830 | 3030 | 270 |
| 20 | 0.990 | 0.000 | 0.10 | 1.040 | 0.4000 | 0.250 | 815 | 2900 | 280 |
| 21 | 0.990 | 0.000 | 0.50 | 1.040 | 0.3925 | 0.250 | 820 | 2880 | 290 |
| 22 | 0.990 | 0.000 | 0.85 | 1.040 | 0.3900 | 0.250 | 660 | 2410 | 310 |
| 23* | 0.990 | 0.000 | 0.90 | 1.040 | 0.3725 | 0.250 | 460 | 1800 | 310 |
| 24* | 0.990 | 0.000 | 0.00 | 1.040 | 0.4200 | 0.200 | 870 | 3130 | 270 |
| 25 | 0.990 | 0.000 | 0.10 | 1.040 | 0.4175 | 0.200 | 840 | 2910 | 290 |
| 26 | 0.990 | 0.000 | 0.75 | 1.040 | 0.4000 | 0.200 | 770 | 2650 | 315 |
| 27* | 0.990 | 0.000 | 0.90 | 1.040 | 0.3900 | 0.200 | 470 | 1280 | 315 |
| 28* | 0.995 | 0.000 | 0.00 | 1.080 | 0.4650 | 0.100 | — | — | — |
| 29 | 0.995 | 0.000 | 0.10 | 1.080 | 0.4500 | 0.100 | 850 | 2550 | 320 |
| 30 | 0.995 | 0.000 | 0.50 | 1.080 | 0.4400 | 0.100 | 840 | 2490 | 340 |
| 31 | 0.995 | 0.000 | 0.60 | 1.080 | 0.4200 | 0.100 | 740 | 2200 | 340 |
| 32* | 0.995 | 0.000 | 0.70 | 1.080 | 0.4100 | 0.100 | 440 | 1380 | 350 |
| 33* | 0.995 | 0.000 | 0.00 | 1.100 | 0.4700 | 0.075 | — | — | — |
| 34 | 0.995 | 0.000 | 0.10 | 1.100 | 0.4600 | 0.075 | 720 | 2350 | 330 |
| 35 | 0.995 | 0.000 | 0.25 | 1.100 | 0.4575 | 0.075 | 760 | 2300 | 330 |
| 36 | 0.995 | 0.000 | 0.50 | 1.100 | 0.4575 | 0.075 | 800 | 2310 | 350 |
| 37* | 0.995 | 0.000 | 0.75 | 1.100 | 0.4400 | 0.075 | 400 | 1550 | 360 |

TABLE 2-continued

| | $(Pb_{(a-b)}Ba_b)\{(Ni_{(1-c)\cdot d/3}Zn_{c\cdot d/3}Nb_{2/3})_zTi_xZr_{(1-x-z)}\}O_3$ | | | | | | Piezoelectric constant $d_{33}$ | Dielectric constant $\epsilon r$ | Curie point Tc |
|---|---|---|---|---|---|---|---|---|---|
| Samples | a | b | c | d | x | z | (pm/V) | (-) | (° C.) |
| 38* | 0.995 | 0.000 | 0.00 | 1.150 | 0.4650 | 0.050 | — | — | — |
| 39  | 0.995 | 0.000 | 0.10 | 1.150 | 0.4600 | 0.050 | 660 | 2000 | 340 |
| 40  | 0.995 | 0.000 | 0.20 | 1.150 | 0.4600 | 0.050 | 640 | 2010 | 340 |
| 41* | 0.995 | 0.000 | 0.30 | 1.150 | 0.4400 | 0.050 | 440 | 1410 | 350 |
| 42* | 0.990 | 0.000 | 0.50 | 1.200 | 0.4600 | 0.025 | — | — | — |
| 43* | 0.990 | 0.000 | 0.50 | 1.040 | 0.3680 | 0.300 | 855 | 3100 | 260 |

In Samples 1 to 5, the molar values of b, c, d, x, and z of the piezoelectric ceramic compositions are within the scope of the present invention and the molar amount a of Pb that is an A site component is varied.

In Sample 1, the molar amount a of the A site component is 1.000, that is, the molar amount a is excessively large. Therefore, the reaction proceeded excessively during calcining, thereby impairing sintering properties. No bulk sample was therefore obtained under the following conditions: a firing temperature of 1000° C. and a firing time of five hours. No piezoelectric properties (piezoelectric constant $d_{33}$, dielectric constant $\epsilon r$ and Curie point Tc) were determined.

In Sample 5, the molar amount a of the A site component is 0.970, that is, the molar amount a is excessively small and is seriously different from the stoichiometric composition (1.000); hence, sintering properties are insufficient. In this case as well as Sample 1, no bulk sample was obtained under the following conditions or no piezoelectric properties (piezoelectric constant $d_{33}$, dielectric constant $\epsilon r$ and Curie point Tc) were determined: a firing temperature of 1000° C. and a firing time of five hours.

In Samples 2 to 4, the molar amount a of the A site component ranges from 0.975 to 0.998, that is, the molar amount a is within the scope of the present invention; hence, the sintered bodies were obtained under the following conditions: a firing temperature of 1000° C. and a firing time of five hours. The piezoelectric constant $d_{33}$ ranges from 620 to 830 pm/V, that is, the piezoelectric constant $d_{33}$ can be controlled to be 530 pm/V or more. The dielectric constant $\epsilon r$ ranges from 1710 to 2800, that is, the dielectric constant $\epsilon r$ can be controlled to be 3000 or less. The Curie point Tc is 310° C., that is, the Curie point Tc can be controlled to be 280° C. or more.

In Samples 6 to 9, the molar values of a, c, d, x and z of the piezoelectric ceramic compositions are within the scope of the present invention and the molar amount (replacement rate) b of Ba in the A site is varied.

In Sample 9, the molar amount b of Ba in the A site is 0.075 and the Curie point Tc is 270° C., that is, the molar amount b is large and therefore the Curie point Tc is lower than 280° C.

In Samples 6 to 8, the molar amount b of Ba in the A site ranges from 0.000 to 0.050, that is, the molar amount b is within the scope of the present invention. The Curie point Tc ranges from 290° C. to 350° C., that is, the Curie point Tc can be controlled to be 280° C. or more. The dielectric constant $\epsilon r$ ranges from 2310 to 2360, that is, the dielectric constant $\epsilon r$ can be controlled to be 3000 or less. The piezoelectric constant $d_{33}$ ranges from 770 to 830 pm/V, that is, the piezoelectric constant $d_{33}$ can be controlled to be 530 pm/V or more. In Samples 7 to 9, Ba is used as a substitutional element and the use of Sr or Ca showed the same results as the above.

In Samples 10 to 13, the molar values of a, b, c, x, and z of the piezoelectric ceramic compositions are constant and are within the scope of the present invention and the molar amount d of Ni and Zn, which are acceptor elements, in a third component in the B site is varied.

In Sample 13, the molar amount d is 1.500, that is, the molar amount d is excessively large and therefore sintering properties are insufficient. Hence, no sintered body was obtained under the following conditions: a firing temperature of 1000° C. and a firing time of five hours.

In Samples 10 to 12, the molar amount d ranges from 1.020 to 1.400, that is, the molar amount d is within the scope of the present invention. The piezoelectric constant $d_{33}$ ranges from 630 to 820 pm/V, that is, the piezoelectric constant $d_{33}$ is sufficient for practical use. The dielectric constant $\epsilon r$ ranges from 1930 to 2690, that is, the dielectric constant $\epsilon r$ can be controlled to be 3000 or less. The Curie point Tc is 310° C., that is, the Curie point Tc can be controlled to be 280° C. or more.

In Samples 14 to 18, the molar values of a, b, c, d, and z of the piezoelectric ceramic compositions are within the scope of the present invention and the molar amount x of Ti in the B site is varied.

In Sample 14, the molar amount x is 0.3800, that is, the molar amount x is excessively small; hence, the composition of a solid solution is not close to the MPB. The piezoelectric constant $d_{33}$ is 420 pm/V, that is, the piezoelectric constant $d_{33}$ is small and is insufficient for practical use.

In Sample 18, the molar amount x is 0.4800, that is, the molar amount x is excessively large; hence, the composition of a solid solution is not close to the MPB. The piezoelectric constant $d_{33}$ is 410 pm/V, that is, the piezoelectric constant $d_{33}$ is small and is insufficient for practical use.

In Samples 15 to 17, the molar amount x ranges from 0.3900 to 0.4700, that is, the molar amount x is within the scope of the present invention. The Curie point Tc ranges from 290° C. to 380° C., that is, the Curie point Tc can be controlled to be 280° C. or more. The dielectric constant $\epsilon r$ ranges from 1630 to 2050, that is, the dielectric constant $\epsilon r$ can be controlled to be 3000 or less. The piezoelectric constant $d_{33}$ ranges from 530 to 740 pm/V, that is, the piezoelectric constant $d_{33}$ is sufficient.

In Samples 19 to 43, the molar amounts a, b, d, and x of the piezoelectric ceramic compositions are within the scope of the present invention and the molar ratio c of Zn and the molar amount z of the third component are varied in combination.

In Sample 19, the molar ratio c and the molar amount z are 0.00 and 0.250, respectively, and are outside the scope of the present invention that is defined with Hexagon ABCDEF in FIG. 1. Therefore, the Curie point Tc is 270° C., that is, the Curie point Tc is insufficient.

In Sample 23, the molar ratio c and the molar amount z are 0.90 and 0.250, respectively, and are outside the scope of the present invention. Therefore, the piezoelectric constant $d_{33}$ is 460 pm/V, that is, the piezoelectric constant $d_{33}$ is insufficient.

In Sample 24, the molar ratio c and the molar amount z are 0.00 and 0.200, respectively, and are outside the scope of the present invention. Therefore, the dielectric constant ϵr and the Curie point Tc are 3130 and 270° C., respectively, that is, the dielectric constant ϵr is excessively large and the Curie point Tc is insufficient.

In Sample 27, the molar ratio c and the molar amount z are 0.090 and 0.200, respectively, and are outside the scope of the present invention. Therefore, the piezoelectric constant $d_{33}$ is 470 pm/V, that is, the piezoelectric constant $d_{33}$ is insufficient.

In Sample 28, the molar ratio c and the molar amount z are 0.00 and 0.100, respectively, and are outside the scope of the present invention; hence, sintering properties are insufficient. Therefore, no bulk sample was obtained under the following conditions: a firing temperature of 1000° C. and a firing time of five hours.

In Sample 32, the molar ratio c and the molar amount z are 0.75 and 0.100, respectively, and are outside the scope of the present invention. Therefore, the piezoelectric constant $d_{33}$ is 440 pm/V, that is, the piezoelectric constant $d_{33}$ is insufficient.

In Sample 33, the molar ratio c and the molar amount z are 0.00 and 0.075, respectively, and are outside the scope of the present invention; hence, sintering properties are insufficient. Therefore, no bulk sample was obtained under the following conditions: a firing temperature of 1000° C. and a firing time of five hours.

In Sample 37, the molar ratio c and the molar amount z are 0.75 and 0.075, respectively, and are outside the scope of the present invention. Therefore, the piezoelectric constant $d_{33}$ is 400 pm/V, that is, the piezoelectric constant $d_{33}$ is insufficient.

In Sample 38, the molar ratio c and the molar amount z are 0.00 and 0.050, respectively, and are outside the scope of the present invention; hence, sintering properties are insufficient. Therefore, no bulk sample was obtained under the following conditions: a firing temperature of 1000° C. and a firing time of five hours.

In Sample 41, the molar ratio c and the molar amount z are 0.30 and 0.050, respectively, and are outside the scope of the present invention. Therefore, the piezoelectric constant $d_{33}$ is 440 pm/V, that is, the piezoelectric constant $d_{33}$ is insufficient.

In Sample 42, the molar ratio c and the molar amount z are 0.50 and 0.025, respectively, and are outside the scope of the present invention; hence, sintering properties are insufficient. Therefore, no bulk sample was obtained under the following conditions: a firing temperature of 1000° C. and a firing time of five hours.

In Sample 43, the molar ratio c and the molar amount z are 0.50 and 0.300, respectively, and are outside the scope of the present invention. Therefore, the Curie point Tc is 260° C., that is, the Curie point Tc is insufficient.

Samples 20 to 22, 25, 26, 29 to 31, 34 to 36, 39 and 40 satisfy the scope of the present invention. Therefore, the piezoelectric constant $d_{33}$ is 530 pm/v or more, the dielectric constant ϵr is less than 3000 and the Curie point Tc is 280° C. or higher although the temperature of firing treatment is 1000° C. This shows that a large piezoelectric constant $d_{33}$, a small dielectric constant and a high Curie point Tc can be achieved although the temperature of firing treatment is low.

EXAMPLE 2

Ceramic sources similar to those described in Example 1 were weighed such that compositions shown in Table 3 were obtained. Bulk samples for Samples 51a to 56a were prepared by substantially the same method or procedure as that described in Example 1 except that the firing temperature was varied between 950° C. and 1150° C.

Monolithic piezoelectric devices for Samples 51b to 56b having composition formulas shown in Table 3 were prepared.

In particular, the ceramic sources were weighed such that the compositions shown in Table 3 were obtained. Ceramic green sheets were then prepared by substantially the same method or procedure as that described in Example 1.

The following paste was prepared: a conductive paste containing a conductive material containing Ag and Pd at a weight ratio of 7:3. Internal electrodes are formed on some of the ceramic green sheets by a screen printing process. A predetermined number of the resulting ceramic green sheets were stacked. The ceramic green sheets having no internal electrodes were pressed against both end faces of each stack, whereby a green compact was obtained.

The green compact was degreased at 360° C. for two hours and then fired at a temperature of 950° C. to 1150° C. for five hours such that the internal electrodes and the ceramic green sheets were co-fired, whereby a monolithic sintered body including the internal electrodes embedded therein was obtained.

A conductive paste principally containing Ag was applied onto both end faces of the monolithic sintered body, which was then baked, whereby external electrodes electrically connected to the internal electrodes were formed. The monolithic sintered body was subjected to polarization at a field density of 3 kV/m in oil. The monolithic piezoelectric devices for Samples 51b to 56b were prepared as described above.

Table 3 shows the compositions of Samples 51a to 56a (the bulk samples) and Samples 51b to 56b (the monolithic piezoelectric devices).

TABLE 3

| | $Pb_a\{(Ni_{(1-c)\cdot d/3}Zn_{c\cdot d/3}Nb_{2/3})_z Ti_x Zr_{(1-x-z)}\}O_3$ | | | | | |
|---|---|---|---|---|---|---|
| Samples | a | c | d | x | z | |
| 51a | 0.985 | 0.50 | 1.020 | 0.4075 | 0.200 | Excessive in |
| 51b | | | | | | acceptor |
| 52a | 0.985 | 0.50 | 1.080 | 0.4075 | 0.200 | Excessive in |
| 52b | | | | | | acceptor |
| 53a* | 0.990 | 0.50 | 1.000 | 0.4225 | 0.150 | Stoichiometric |
| 53b* | | | | | | |
| 54a* | 0.985 | 0.50 | 1.000 | 0.4075 | 0.200 | Stoichiometric |
| 54b* | | | | | | |
| 55a* | 0.985 | 0.50 | 0.990 | 0.4100 | 0.201 | Excessive in |
| 55b* | | | | | | donor |
| 56a* | 0.985 | 0.50 | 0.980 | 0.4100 | 0.204 | Excessive in |
| 56b* | | | | | | donor |

Samples with an asterisk are outside the scope of the present invention.

As is clear from Table 3, the molar amount d of acceptor elements (Ni and Zn) is greater than the stoichiometric composition (1.000) in Samples 51a, 52a, 51b and 52b. That is, Samples 51a, 52a, 51b and 52b are excessive in acceptor. Samples 53a, 54a, 53b and 54b are stoichiometric. In Samples 55a, 56a, 55b and 56b, the molar in Samples 51a, 52a, 51b, and 52b,d of acceptor elements (Ni and Zn) is less than the stoichiometric composition (1.000). That is, Samples 55a, 56a, 55b and 56b are excessive in donor elements.

These samples were measured for piezoelectric constant $d_{33}$ by substantially the same method as that described in Example 1.

Table 4 shows the piezoelectric constant $d_{33}$ of each of Samples 51a to 56a prepared at different firing temperatures. Table 5 shows the piezoelectric constant $d_{33}$ of each of Samples 51b to 56b prepared at different firing temperatures.

TABLE 4

| | Piezoelectric Constant $d_{33}$ (pm/V) | | | | |
|---|---|---|---|---|---|
| Samples | 950° C. | 1000° C. | 1050° C. | 1100° C. | 1150° C. |
| 51a | 756 | 839 | 798 | — | — |
| 52a | 745 | 817 | 775 | — | — |
| 53a* | 673 | 790 | 828 | 771 | — |
| 54a* | 701 | 801 | 858 | 741 | — |
| 55a* | — | 775 | 847 | 893 | 810 |
| 56a* | — | 743 | 784 | 876 | 769 |

Samples with an asterisk are outside the scope of the present invention.

TABLE 5

| | Piezoelectric Constant $d_{33}$ (pm/V) | | | | |
|---|---|---|---|---|---|
| Samples | 925° C. | 950° C. | 1000° C. | 1050° C. | 1100° C. |
| 51b | 568 | 835 | 721 | — | — |
| 52b | 541 | 825 | 806 | — | — |
| 53b* | — | 750 | 852 | 707 | — |
| 54b* | — | 780 | 863 | 782 | — |
| 55b* | — | — | 786 | 862 | 728 |
| 56b* | — | — | 755 | 836 | 745 |

Samples with an asterisk are outside the scope of the present invention.

As is clear from Table 4, which are stoichiometric, the piezoelectric constant peaks at a firing temperature of 1050° C. in Samples 53a and 54a. In Samples 55a and 56a, which are excessive in donor elements, the piezoelectric constant peaks at a firing temperature of 1100° C.

In Samples 51a and 52a which are within the scope of the present invention and which are excessive in acceptor elements, the piezoelectric constant peaks at a firing temperature of 1000° C.

As is clear from Table 5, which are stoichiometric, the piezoelectric constant peaks at a firing temperature of 1000° C. In Samples 55b and 56b, which are excessive in donor elements in Samples 53b and 54b, the piezoelectric constant peaks at a firing temperature of 1050° C.

In Samples 51b and 52b which are within the scope of the present invention and which are excessive in acceptor elements, the piezoelectric constant peaks at a firing temperature of 950° C.

The optimum firing temperature of the piezoelectric ceramic compositions that are within the scope of the present invention and that are excessive in acceptor elements, that is, the firing temperature at which the largest piezoelectric constant $d_{33}$ is achieved is about 50° C. lower than that of the piezoelectric ceramic compositions that are stoichiometric or is about 100° C. lower than that of the piezoelectric ceramic compositions that are excessive in donor elements. The piezoelectric ceramic compositions that are within the scope of the present invention can be fired at a lower temperature as compared to conventional compositions.

For the monolithic piezoelectric devices for Samples 51b and 52b, the inventors have experimentally confirmed that the largest piezoelectric constant $d_{33}$ is achieved at a firing temperature of 950° C. as shown in Table 5 although the ratio of Ag to Pd in the internal electrodes is increased to about 9:1 on a weight basis. That is, the usual weight ratio of Ag to Pd therein of about 7:3 may be increased to about 9:1. This allows the content of Pd to be reduced, thereby reducing the manufacturing cost.

The invention claimed is:

1. A piezoelectric ceramic composition having the composition formula $(Pb_{(a-b)}Me_b)\{(Ni_{(1-c)\cdot d/3}Zn_{c\cdot d/3}Nb_{2/3})_z Ti_x Zr_{(1-x-z)}\}O_3$, wherein Me is at least one element selected from the group consisting of Ba, Sr and Ca; a, b, c, d, x and z satisfy the inequalities $0.975 \leq a \leq 0.998$, $0 \leq b \leq 0.05$, $1 < d \leq 1.40$, and $0.39 \leq x \leq 0.47$; and c and z are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines on a graph of z and c.

2. The piezoelectric ceramic composition according to claim 1, wherein $1.02 \leq d \leq 1.40$.

3. The piezoelectric ceramic composition according to claim 2, wherein Me is one member of the group.

4. The piezoelectric ceramic composition according to claim 3, wherein Me is Ba.

5. The piezoelectric ceramic composition according to claim 2, wherein $0.990 \leq a$, $0=b$, $1.04 \leq d \leq 1.150$ and $0.3925 \leq x \leq 0.4600$.

6. The piezoelectric ceramic composition according to claim 1, wherein Me is one member of the group.

7. The piezoelectric ceramic composition according to claim 6, wherein Me is Ba.

8. A piezoelectric actuator containing a ceramic body containing the piezoelectric ceramic composition according to claim 6.

9. The piezoelectric actuator according to claim 8, further comprising internal electrodes embedded in the ceramic body.

10. The piezoelectric actuator according to claim 9, wherein the internal electrodes comprise Ag.

11. A piezoelectric actuator containing a ceramic body containing the piezoelectric ceramic composition according to claim 5.

12. The piezoelectric actuator according to claim 11, further comprising internal electrodes embedded in the ceramic body.

13. The piezoelectric actuator according to claim 12, wherein the internal electrodes comprise Ag.

14. A piezoelectric actuator containing a ceramic body containing the piezoelectric ceramic composition according to claim 2.

15. The piezoelectric actuator according to claim 14, further comprising internal electrodes embedded in the ceramic body.

16. The piezoelectric actuator according to claim 15, wherein the internal electrodes comprise Ag.

17. The piezoelectric actuator according to claim 16 in which $0.2 \leq c \leq 0.75$ and $0.1 \leq z \leq 0.21$.

18. A piezoelectric actuator containing a ceramic body containing the piezoelectric ceramic composition according to claim 1.

19. The piezoelectric actuator according to claim 18, further comprising internal electrodes embedded in the ceramic body.

20. The piezoelectric actuator according to claim 19, wherein the internal electrodes comprise Ag.

* * * * *